United States Patent [19]
Connell et al.

[11] Patent Number: 5,999,115
[45] Date of Patent: Dec. 7, 1999

[54] SEGMENTED DAC USING PMOS AND NMOS SWITCHES FOR IMPROVED SPAN

[75] Inventors: Lawrence E. Connell; Alexander Dribinsky, both of Naperville, Ill.

[73] Assignee: Motorola, Inc., Schaumburg, Ill.

[21] Appl. No.: 09/063,242

[22] Filed: Apr. 20, 1998

[51] Int. Cl.⁶ .................................................... H03M 1/68
[52] U.S. Cl. .......................................... 341/145; 341/154
[58] Field of Search ..................................... 341/145, 154, 341/148

[56] References Cited

U.S. PATENT DOCUMENTS

| | | | |
|---|---|---|---|
| 4,338,591 | 7/1982 | Tuthill | 340/347 DA |
| 4,638,303 | 1/1987 | Masuda et al. | 341/145 |
| 4,918,448 | 4/1990 | Hauviler et al. | 341/145 |
| 5,111,205 | 5/1992 | Morlon | 341/156 |
| 5,214,668 | 5/1993 | Satou et al. | 374/117 |
| 5,495,245 | 2/1996 | Ashe | 341/145 |
| 5,703,588 | 12/1997 | Rivoir et al. | 341/145 |

OTHER PUBLICATIONS

Burton et al., *Microprocessor Systems Handbook,* copyright 1977 Analog Devices Inc. pp. 148 and 149 LOC catalog card #77–88133.

Post et al., "A 14 Bit Monotonic NMOS D/A Converter," IEEE Journal of Solid–State Circuits, vol. SC–18, No. 3, Jun. 1983.

Cummins et al., "An IEEE1451 Standard Tranducer Interface Chip," 1998 IEEE International Solid–State Circuits Conference, ISSCC98, Session 17, Sensor Technology, Paper SA 17.3.

*Primary Examiner*—Howard L. Williams
*Attorney, Agent, or Firm*—Brian M. Mancini

[57] ABSTRACT

A digital-to-analog converter with cascaded coarse and fine resistor divider strings. The fine resistor string contains $2^N$ or more resistor segments controlled by N number of fine divider control bits. Resistors located at each end of the fine divider string are a fraction of the nominal value for the remaining fine divider resistor segments. The on-resistance of switches coupling the coarse and fine resistor divider strings is less than or equal to a predetermined fraction of the nominal value for the fine divider resistor segments to minimize contributions to linearity error. The DAC uses all CMOS devices including NMOS and PMOS switches which utilize approximately the full rail-to-rail voltage of the voltage source without the use of additional amplifiers. The DAC provides linearity of about one-fourth LSB.

15 Claims, 6 Drawing Sheets

—PRIOR ART—

SEGMENTED DAC USING PMOS AND NMOS SWITCHES FOR IMPROVED SPAN

FIELD OF THE INVENTION

The present invention relates generally to digital-to-analog and analog-to-digital converters in communication devices and, in particular, digital-to-analog and analog-to-digital converters used in communication devices and microprocessors.

BACKGROUND OF THE INVENTION

Prior art potentiometric digital-to-analog converters (DAC) utilize two cascaded resistor divider strings, as shown in FIG. 1. A course resistor divider is connected between ground and a reference voltage and provides $2^M$ equal resistor segments where M represents the number of course divider bits used to select where to tap a voltage along the course resistor divider. A fine resistor divider is connected through a set of coarse divider switches across one of the coarse divider segments selected by the M coarse divider bits. The fine resistor divider has equally valued segments and subdivides the resistance of the selected coarse divider segment to provide an analog voltage output. Typically, the fine resistor divider is controlled by N fine divider bits, and the resolution of the DAC is M+N bits.

A major problem with the prior art DAC is a linearity error caused by the switches which couple the fine and coarse resistor dividers. Typically, the coupling switches are NMOS transistors, as are known in the art, which carry current which produces a voltage drop across the switch introducing the linearity error. As the error approaches the voltage step defined by the least significant bit (LSB), the DAC will produce an incorrect voltage output. The prior art proposes to mitigate the linearity error of the switches by using a fine divider which consists of only $2^N-1$ resistors and attempting to match the on-resistance of the coupling switches to a fraction of the resistance of a fine divider segment. In this way, the error introduced by the coupling switches should be less than the resolution defined by a fine resistor divider segment. However, the attempt to match resistance is extremely poor due to process and temperature variations. Therefore, differential non-linearity degrades significantly in the prior art DAC.

Another major problem with the prior art DAC is that the attempts to match the resistances of the coupling switch and divider segment require the reference voltage to be less than half of the supply voltage. Generally, this requires the addition of an amplifier to approximately double the output voltage to restore its voltage range. However, as a result, the integral linearity and noise immunity performance of the prior art DAC is degraded by about one-half.

There is a need for a precision high-resolution DAC that has a linearity better than a resolution of ½ LSB. There is also a need for a DAC that can utilize approximately the full rail-to-rail voltage of the voltage source without the use of additional amplifiers. In addition, it would be an advantage to provide a DAC with a minimal number of switches so as to reduce size and cost. Another improvement, would be to provide a DAC utilizing all CMOS devices and including NMOS and PMOS switches while minimizing the linearity error contribution by the on-resistance of the switches.

DETAILED DESCRIPTION OF THE PREFERRED EMBODIMENT

The present invention provides a precision high-resolution DAC that has a linearity better than ½ LSB. The DAC utilizes all CMOS devices, including NMOS and PMOS switches, while minimizing the linearity error contribution by the on-resistance of the switches. Also, the DAC utilizes approximately the full rail-to-rail voltage of the voltage source without the use of additional amplifiers or external devices. In addition, the DAC has a minimal number of switches so as to reduce size and cost.

Figure 1:
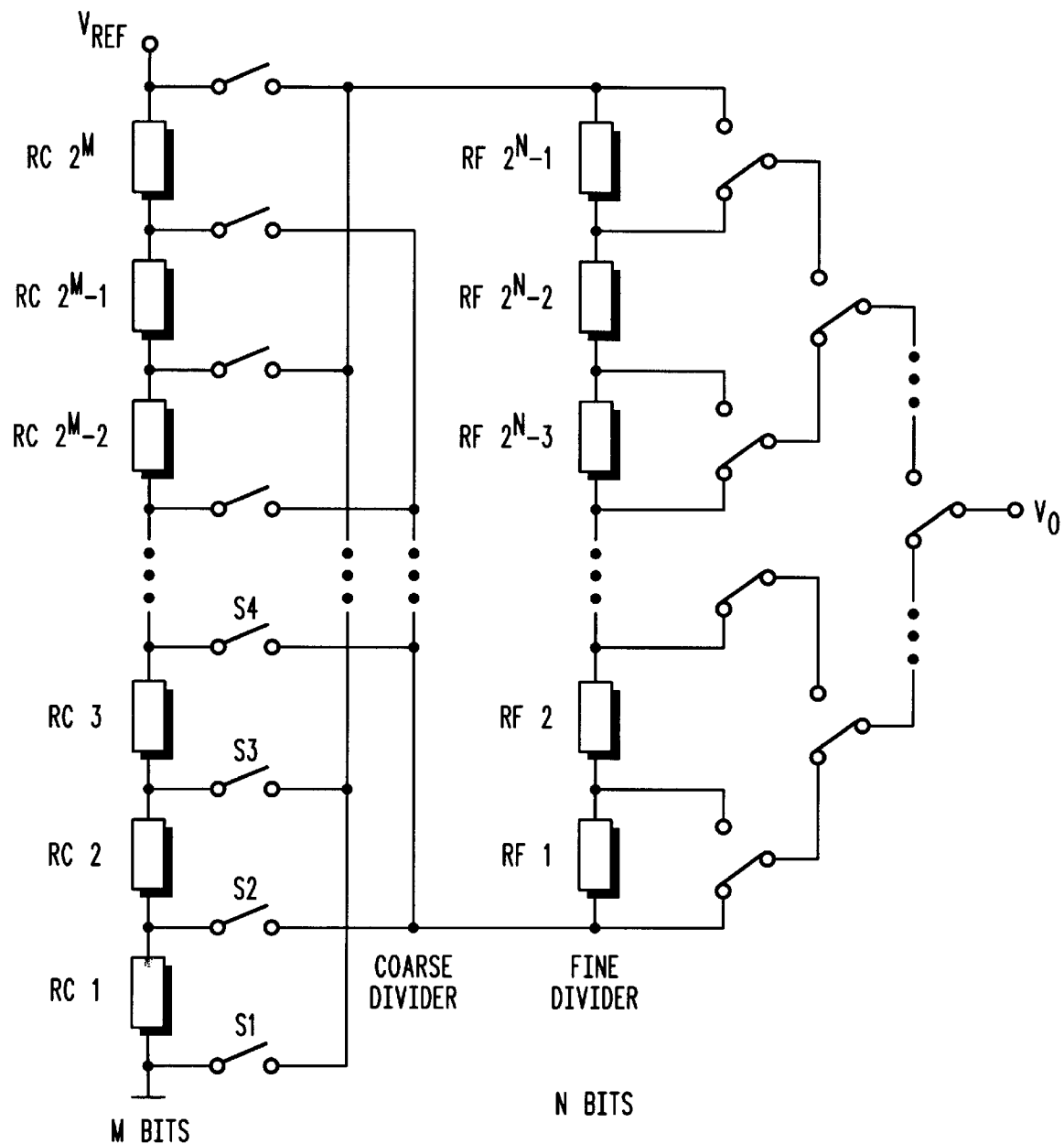
FIG. 1 is a simplified schematic diagram of a prior art resistive digital-to-analog converter.

Digital-to-analog converters (DACs) take a digital input and generate an analog voltage therefrom. FIG. 1 shows a prior art resistive DAC including two cascaded resistor strings. A digital input (not shown), consisting of M+N bits is used to control the DAC switches. The M bits are the most significant bits (MSB) and are used to control the coarse divider which results in large steps in the output voltage, Vo, and the N bits are the least significant bits (LSB) and are used to control the fine divider which results in small steps in the output voltage, Vo. A change of one least significant bit changes the analog output voltage a minimum amount, equal to a resolution of the DAC.

In practice, the switches are provided by multiplexers which are controlled by an input register which can accept a parallel or serial digital word. The input register can be of a latched or unlatched variety. Generally, the digital input is separated into approximately equal portions, the first portion (MSB) of M bits is designated for controlling the coarse divider and the second portion (LSB) of N bits is designated for controlling the fine divider. Typically in the prior art, the M bits are used to switchably connect between $2^M$ equal coarse divider segments (resistors), and the N bits are used to select an output voltage tap provided by the subdividing $2^N-1$ equal fine divider segments (resistors). For example, in a 14-bit DAC having seven MSB and seven LSB there are 128 equal coarse divider segments (resistors) and 127 equal fine divider segments (resistors).

A major problem in the prior art DAC is that the coarse divider switches used to couple the coarse and fine resistors are typically NMOS transistors which have an on-resistance of their own. The coarse divider switches are current carrying which contributes an additional voltage drop to the fine divider string. This voltage drop degrades the linearity of the DAC and must be taken into account.

Generally, prior art DACs attempt to compensate for the on-resistance of the coarse divider switches using two methods. The first method to compensate for the on-resistance of the coarse divider switches is to add an op-amp buffer at the coarse divider switches to reduce the loading from the fine divider string. This method reduces the voltage drop problem across the switch so that a full string of $2^N$ fine divider segments can be used. However, op-amps have power-supply rejection and noise problems, in addition to added cost and complexity of the DAC circuit.

The second method includes configuring the coarse divider switches to have an on-resistance that is matched to half of the resistance of a fine divider segment. In this way, the two coarse divider switches tapped across a particular coarse segment are treated as one fine divider segment. As a result, the fine divider string has one less segment ($2^N-1$) for a given number of fine divider control bits N.

Figure 2:
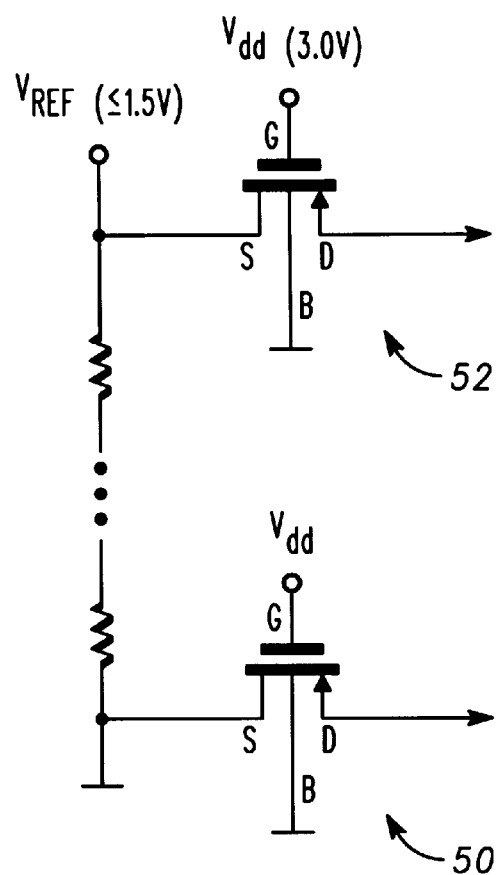
FIG. 2 is a simplified schematic diagram of NMOS coarse divider switches as used in the prior art DAC of FIG. 1.

In practice, the ability to match the on-resistance of the coarse divider switches is extremely poor due to process and temperature variations and voltage conditions. As a result, prior art DACs have linearity problems in the analog output voltages. In previous attempts to match the resistance of the coupling switches to half of the resistance of a fine divider segment, the prior art has chosen to use single channel NMOS switches and restrict the range of the reference voltage to be less than one half the available supply voltage. Referring to FIG. 2 for example, the on-resistance for each NMOS transistor switch can be calculated from:

$$Ron=L/(W*B*(Vgs-Vt))$$

where L and W are the respective lengths and widths of the transistor channel, B is the conductance constant, Vgs is the gate-to-source voltage at each switch, and Vt is the threshold voltage of the transistor. Vdd is the available source voltage. The threshold voltage of a MOS transistor is typically about 0.75V to 1.25V depending on the voltage drop from the source to the body which can range from about 0V to 1.50V.

Vgs changes for each switch depending on the location where the switch taps into the coarse divider string. The higher up the string the lower the available voltage to drive Vgs. Switching the transistor "on" consists of driving Vgs to be greater than the threshold voltage, Vgs≧Vt. Vgs is derived from the applied gate voltage and the voltage available from a tap of the coarse divider string being driven by Vref. Typically, the source voltage, Vdd, is used to drive the gate of the transistor. As long as the gate voltage minus the tapped voltage from Vref is much greater than the threshold voltage, Vt, the transistor is easily switched on. For example, in the first transistor 50 of FIG. 2, if Vdd is 3.0V and the tap voltage on the transistor source is 0V as shown, than Vgs is 3.0V. This is at least 1.75V over that voltage (Vt) needed to switch the transistor on.

However, as the tap location of the transistor moves up the coarse divider string, less voltage is available to drive Vgs. For transistor 52 of FIG. 2, Vgs=(Vdd−Vref). Using the values of the previous example, where Vdd=3.0V, Vt=1.25V, and Vref=1.5V, Vgs−Vt=0.25 and Ron=L/(W*B*0.25). Under these conditions, Ron is very sensitive to the quantity Vgs−Vt and a small change occurring in any one of Vdd, Vt, or Vref will produce a significant variation in the switch resistance Ron. Therefore, prior art DACs have provided a Vref voltage that is less than half Vdd (Vref<Vdd/2). This is a major disadvantage since less than half of the available rail-to-rail voltage is usable in the prior art DAC. To compensate for this, amplifiers with 2× or greater gain are employed in the prior art. However, these amplifiers introduce noise, double the voltage errors of the string dividers, and introduce their own voltage errors. As a result, prior art DACs experience further problems with integral non-linearity and absolute accuracy.

In contrast, the DAC of the present invention utilizes approximately the full rail-to-rail voltage of the voltage source without the use of additional amplifiers or external devices and without the resistance variation problems when Vgs approaches Vt. In addition, the present invention does not require the on-resistance of the transistor switches to equal or match the resistance of the fine divider segments, but instead only requires that the on-resistance of the transistor switches be less than or equal to a predetermined fraction of the resistance of a fine divider segment.

Figure 3:
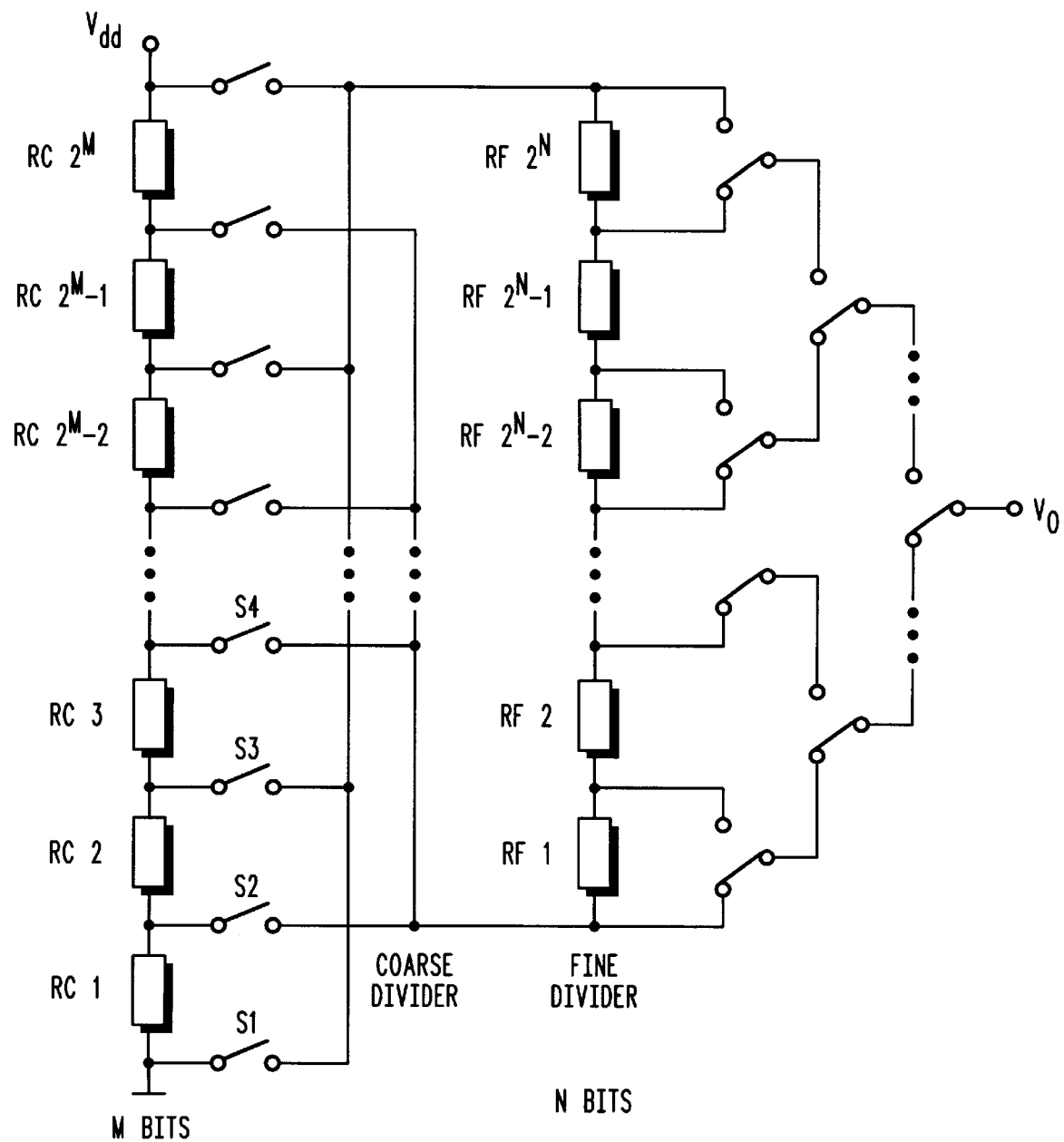
FIG. 3 is a simplified schematic diagram of a first embodiment of a resistive digital-to-analog converter, in accordance with the present invention.

FIG. 3 shows an improved DAC with cascaded coarse and fine resistor divider strings, in accordance with the present invention. The DAC incorporates $2^N$ or more fine resistor segments in the fine divider string controlled by N number of least-significant-bits (LSB) and the least-significant bit of the M coarse divider control bits (MSB). A plurality of coupling switches switchably connects the fine resistor divider string in parallel with a predetermined segment of the coarse resistor string. The coupling switches (coarse divider switches) are controlled by M number of most-significant-bits (MSB) to connect both ends of the predetermined segment of the coarse resistor string to the fine divider string. In addition, this new structure does not require the on-resistance of the coarse divider switches to equal or match the resistance of the fine divider segments, but instead only requires that the on-resistance of the coupling switches be less than or equal to a predetermined fraction of the resistance of the fine divider segments.

In a first embodiment, the fine resistor divider string includes $2^N$ resistors including two end resistor segments on each end of the fine resistor divider string. Each of the end resistor segments (RF1 and RF$2^N$) has a resistance that is a fraction of the nominal resistance of the remaining intervening fine divider segments (RF2 through RF$2^N-1$) of which each has a substantially equal nominal resistance value. Preferably, each of the end resistor segments has a resistance of about three-fourths of the nominal resistance of an intervening fine divider segment.

An on-resistance of the coupling switches is less than or about equal to one-eighth of the nominal resistance of a fine divider resistor segment. Preferably, the on-resistance of the coupling switches is about one-sixteenth the nominal resistance of the fine divider resistor segments.

In practice, the fine resistor divider string has a total resistance Rf, where:

$$Rf=4*Rc*2^N/2^M$$

and Rc is the total resistance of the coarse resistor divider string. This limits the coarse divider error produced by the loading effect of the fine divider to be less than one-fourth LSB. Specifically, when N=M for example, the coarse segments have a resistance of about one kohm, the fine segments have a resistance of about four kohms (LSB), with the two end segments of the fine string having a resistance of about three kohms (three-fourths LSB). The coupling switches are configured to have an on-resistance of from zero to five hundred ohms (one eighth LSB) with an average of about two hundred fifty ohms (one-sixteenth LSB).

In operation, referring to FIG. 3, where RC1 has the fine divider string connected across it and the fine divider string is connected to Vo from its tap between RF1 and RF2, increasing the digital input one LSB requires switching the fine divider string to be across the RC2 segment. When switching between RC1 and RC2, switch S2 remains closed, switch S1 opens, and switch S3 closes effectively flipping the orientation of the fine divider string. However, simultaneous with this action the voltage tap on the fine divider string (connected to the output voltage) must also be switched to enable the tap below RF1 to be selected. This is accomplished by driving the fine divider with the two's complement of the N least-significant-bits whenever the LSB of the M coarse divider bits is a one.

The switching action described above results in a nominal step of 1.125 LSB. Three factors contribute to this step. First, the resistance of end segment RF1 produces a three-fourths LSB step. Second, the change in the loading effect of the fine divider upon the coarse divider as the fine divider is switched from being across RC1 to being across RC2 contributes an additional one-fourth LSB. Third, the remaining one-eighth LSB step is produced by the change in the current induced voltage drop across switch S2 as the fine divider is switched form being across RC1 to being across RC2. If the digital input is increased one additional LSB, a step size of three-fourths LSB results, attributable solely to the resistance of the end segment RF1. In essence, the end resistor segments and coupling switches are uniquely sized to produce an improved high resolution DAC with a differential non-linearity error equal to one-fourth LSB. As the fine divider is switched to an adjacent coarse divider segments, only one of the two activated coarse divider switches is interchanged, and the previous lowest tap of the fine divider becomes the highest voltage tap and vice versa. Simultaneously, the fine divider control bits are changed to their two's complement. The state of the LSB of the M coarse divider bits is used to directly control the two's complement action.

Figure 4:
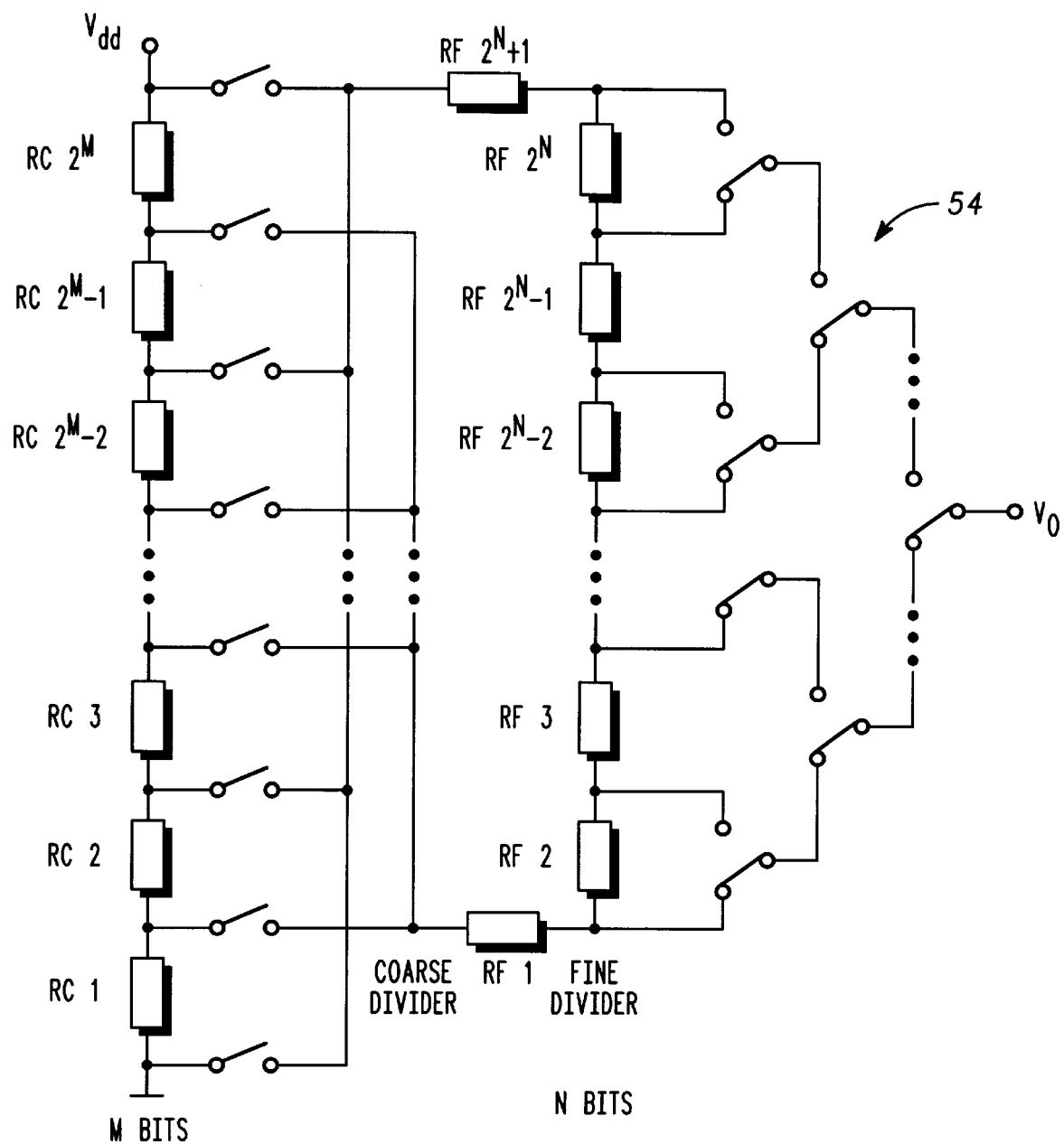
FIG. 4 is a simplified schematic diagram of a second embodiment of a resistive digital-to-analog converter, in accordance with the present invention.

FIG. 4 shows a second embodiment of an improved DAC with cascaded coarse and fine resistor divider strings, in accordance with the present invention. This embodiment of the DAC incorporates $2^N+1$ or more fine resistor segments in the fine divider string controlled by N number of least-significant-bits (LSB) and the least-significant bit of the M coarse divider control bits (MSB). A plurality of coupling switches switchably connects the fine resistor divider string in parallel with a predetermined segment of the coarse resistor string. The coupling switches (coarse divider switches) are controlled by M number of most-significant-bits (MSB) to connect both ends of the predetermined segment of the coarse resistor string to the fine divider string. In addition, this new structure does not require the on-resistance of the coarse divider switches to equal or match the resistance of the fine divider segments, but instead only requires that the on-resistance of the coupling switches be less than or equal to a predetermined fraction of the resistance of a fine divider segment.

In this embodiment, the fine resistor divider string includes end resistor segments on each end of the fine resistor divider string. Each of the end resistor segments (RF1 and RF$2^N+1$) has a resistance that is a fraction of the nominal resistance of the remaining intervening fine divider segments (RF2 through RF$2^N$) of which each has a substantially equal nominal resistance value. Preferably, each of the end resistor segments has a resistance of about one-fourth of the nominal resistance of the remaining intervening fine divider segments. The end resistor segments (RF1 and RF$2^N+1$) are connected in series with the coupling switches to provide a maximum step of about one-half LSB on each end of the fine divider string.

An on-resistance of the coupling switches is less than or equal to one-fourth of a resistance of a fine divider resistor segment. Preferably, the on-resistance of the coupling switches is about one-eighth of the nominal resistance value of the fine divider resistor segments with the end segments set equal to about one-fourth of the nominal resistance value of the fine divider resistor segments.

In practice, the fine resistor divider string has a total resistance Rf, where:

$$Rf = 4 * Rc * 2^N / 2^M$$

and Rc is the total resistance of the coarse resistor divider string. This causes the coarse divider error produced by the loading effect of the fine divider to be about one-fourth LSB. Specifically, when N=M, the coarse divider segments have a resistance of about one kohm, the fine divider segments have a resistance of about four kohms (LSB), the two end segments of the fine string have a resistance of about one kohm (one-fourth LSB), and the coupling switches are configured to have an on-resistance of from zero to one kohm (one-fourth LSB) with an average of about five hundred ohms (one-eighth LSB).

In operation, referring to FIG. 4, where RC2 has the fine divider string connected across it and the fine divider string is connected to Vo from its highest tap (between RF$2^N$ and RF$2^N+1$), increasing the voltage one LSB requires switching the fine divider string to be across the RC3 segment. When switching between RC2 and RC3, switch S3 remains closed, switch S2 opens, and switch S4 closes effectively flipping the orientation of the fine divider string (RF1 becomes RF$2^N+1$, RF2 becomes RF$2^N$, etc.) without changing the voltage tap on the fine divider string (connected to the output voltage). This is accomplished by driving the fine divider with the one's complement of the N least-significant-bits whenever the LSB of the M coarse divider bits is a one. This action results in a maximum step of 1.25 LSB. The voltage drop across S3 and its associated end segment of the fine divider (RF$2^N+1$) totals a maximum of one-half LSB, which is equal and reversed to that before flipping, resulting in a maximum combined change after the flipping action of about one LSB. An additional one-fourth LSB step is produced by the change in the loading effect of the fine divider upon the coarse divider as the fine divider is switched form being across RC2 to being across RC3. Advantageously, the entire action described above requires only one coarse divider switch change which simplifies the control circuitry of the DAC.

Figure 5:
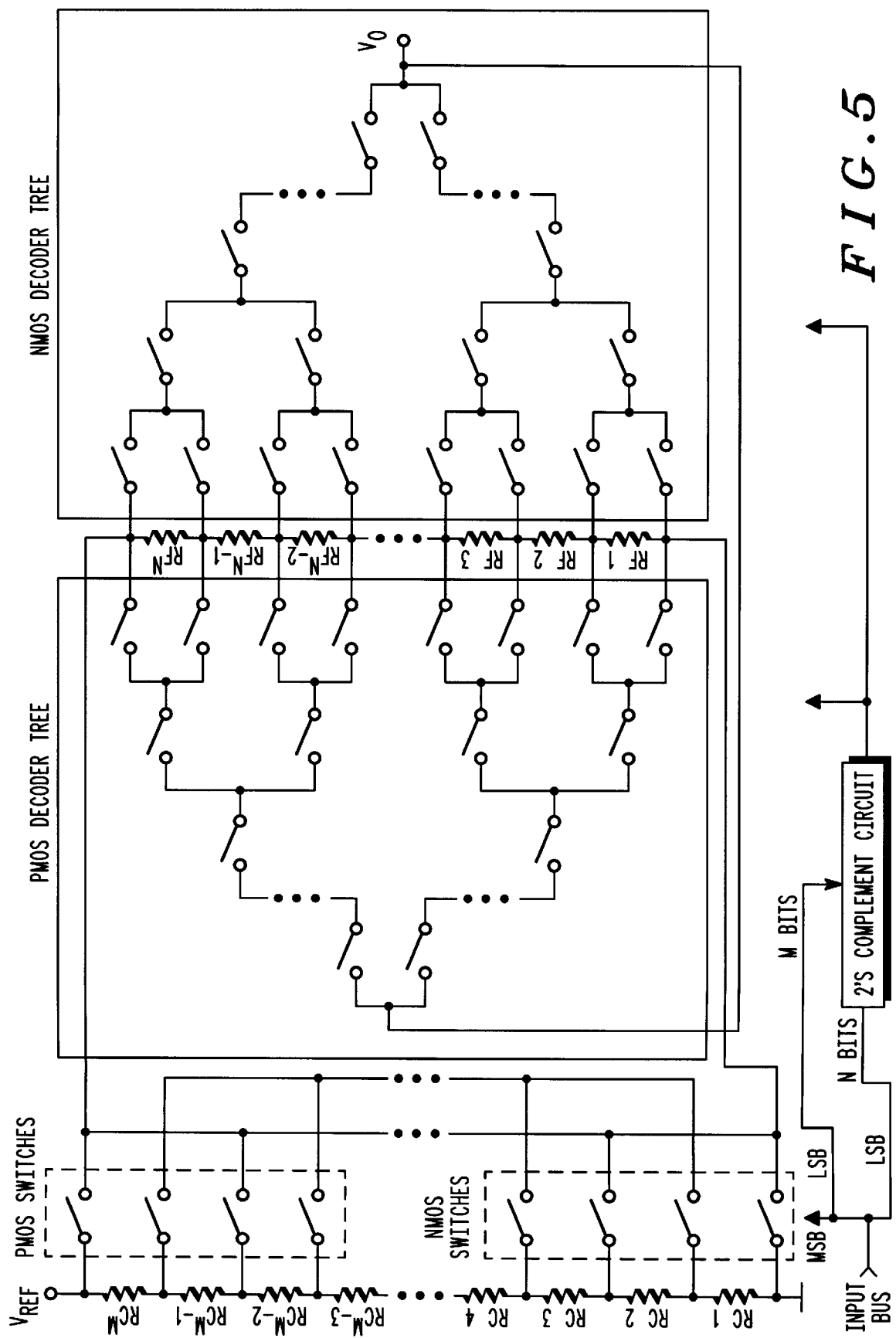
FIG. 5 is a simplified schematic diagram of a preferred embodiment of the resistive digital-to-analog converter of FIG. 3.

Another novel aspect of the present invention is the advantageous use of PMOS and NMOS switches to utilize substantially the entire range of available source voltage (rail-to-rail). As shown in FIG. 5, PMOS coupling switches are used in the coarse divider string where the operating voltage ranges between Vdd and Vdd/2 (the top half of the coarse divider string as shown). NMOS coupling switches are used in the coarse divider string where the operating voltage ranges between Vdd/2 and ground (the bottom half of the coarse divider string as shown).

The fine divider switch network (decoder trees) consists of mirror-imaged PMOS and NMOS devices configured entirely in a parallel and simultaneously controlled (switched) by the N number of least-significant-bits and a least-significant bit of the M coarse divider control bits. Both sides of the network are driven redundantly. In this way, when the course divider string of the DAC is operating in the upper voltage range (Vdd to Vdd/2) the least-significant-bits provide enough gate voltage to overcome the PMOS threshold voltages and cause the PMOS switches to properly connect to the output voltage tap, whereas the same bits will not provide enough potential to switch the NMOS devices on. When the course divider string of the DAC is operating in the lower voltage range (Vdd/2 to ground) the least-significant-bits provide enough gate voltage to overcome NMOS the threshold voltages causing the NMOS switches to properly connect to the output voltage tap, whereas the same bits will not provide enough potential to switch the PMOS devices on. Near Vdd/2 the gate voltages are sufficient to cause at least one if not both sets of PMOS and NMOS devices to properly connect to the output voltage tap (as detailed previously).

The use of NMOS and PMOS devices in the present invention does not require the addition of external amplifiers as is done in the prior art. Therefore, the problems associated with using external amplifiers such as noise, integral non-linearity, and accuracy problems do not exist in the present invention. In addition, the utilization of the full available voltage range reduces noise by at least 6 dB over the prior art.

The novel apparatus of the present invention provides a low cost, single chip solution for application where a precision low-voltage digital-to-analog converter is needed. The present invention can be realized using standard digital CMOS processing, and is particularly useful in microprocessor-based systems and in radio communication devices.

For example, an improved microprocessor can be realized with the precision digital-to-analog converter with cascaded coarse and fine resistor divider strings of the present invention. Typically, along with a memory and an arithmetic logic unit (ALU), a prior art microprocessor can incorporate capacitive dividers in an integrated DAC. However, the present invention provides a resistive DAC that beneficially uses less space on an integrated circuit. Also, the present invention does not require that the integrated circuit manufacturing process contain a capacitor process module and therefore can be realized in a lower cost digital CMOS process. Using techniques known in the art, the improved precision DAC described above can also be combined with a comparator and a control circuit to provide a high performance analog-to-digital converter (ADC) which can be integrated with a microprocessor control circuit in a low cost digital CMOS process.

Moreover, the precision digital-to-analog converter with cascaded coarse and fine resistor divider strings of the present invention can be utilized in a digitally temperature compensated crystal oscillator (DTCXO) circuit. Typically, a DTCXO incorporates a piezoelectric resonator, a temperature sensor, a voltage regulator, a memory, and a precision digital-to-analog converter to drive a tuning circuit. The lower noise DAC of the present invention beneficially provides improved phase noise which is an important consideration in temperature compensated crystal oscillator circuits. In addition, the present invention provides improved linearity and absolute accuracy performance in a TCXO.

EXAMPLE

A 11-bit DAC (5 MSB, 6 LSB) was constructed in accordance with the present invention. Referring to FIG. 5, the two resistor divider strings were provided with 32 ($2^5$) coarse resistors and 64 ($2^6$) fine resistors. To minimize loading error caused by the fine divider string, the total resistance of the fine divider string is set to a value which is at least eight times greater than the total resistance of the coarse divider string. Specifically, the coarse resistor segments were about one kohm and the nominal resistance of the fine divider segments was about four kohms. Consequently, the coarse divider error produced by the fine divider load was limited to one-fourth LSB. To minimize the error caused by the current induce voltage drop across the coupling switches between the fine and coarse divider strings, the coupling switches were sized such that their resistance was less than one-eighth that of a fine divider segment.

To offset the variation of the switch resistance and loading errors described above, the resistors located at each end of the fine divider string were configured to have about three-fourths of the nominal value of a fine divider segment. This configuration advantageously eliminates the need to closely match the switch resistance to the fine divider segment resistance. The reference voltage used was approximately the same as the available power supply voltage, whereas the prior art suffers from having only used less than half the available power supply voltage.

Figure 6:
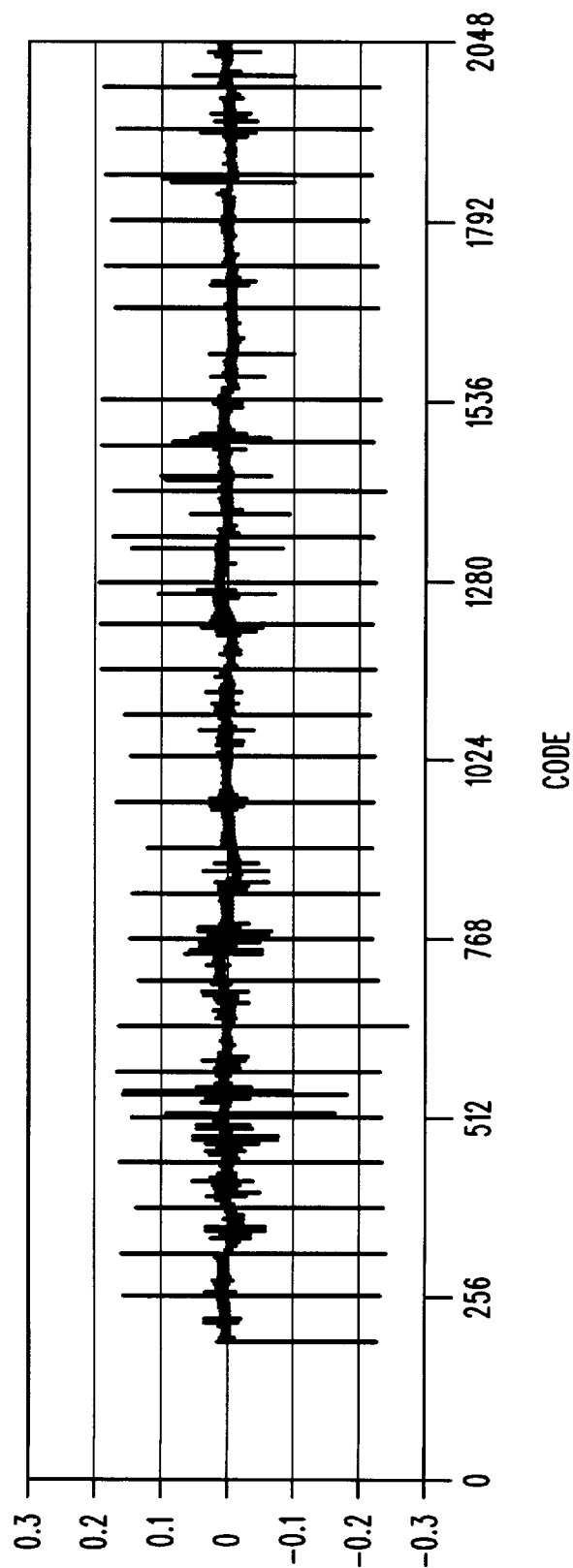
FIG. 6 is a graphical representation of a differential non-linearity error for the digital-to-analog converter of FIG. 5.

As can be seen in FIG. 6, the DAC of FIG. 5 produces about one-fourth LSB differential non-linearity. In addition, the integral linearity, noise immunity, and absolute accuracy of the present invention is about twice as good as that of the prior art.

Although various embodiments of this invention have been shown and described, it should be understood that various modifications and substitutions, as well as rearrangements and combinations of the preceding embodiments, can be made by those skilled in the art, without departing from the novel and broad scope of this invention.

What is claimed is:

1. A precision digital-to-analog converter with cascaded coarse and fine resistor divider strings, the digital-to-analog converter comprising:

a parallel switching tree switchably coupling the fine resistor divider string to an analog output, the switching tree including a plurality of mirror-imaged NMOS and PMOS coupling switches connected in parallel and simultaneously controlled by the N number of least-significant-bits and a least-significant bit of the M coarse divider control bits such that a voltage output of the digital-to-analog converter has a substantially full rail-to-rail voltage range, and wherein the NMOS switches are operable when the fine divider string is connected across a coarse divider string segment having an absolute voltage thereupon of about Vdd/2 or greater, and wherein the PMOS switches are operable when the fine divider string is connected across a coarse divider string segment having an absolute voltage thereupon of about Vdd/2 or less;

the fine resistor divider string including $2^N$ or greater fine resistor segments controlled by the N number of least-significant-bits; and an on-resistance of the coupling switches being a fraction of a nominal resistance value of a fine resistor divider string segment.

2. The precision digital-to-analog converter of claim 1, wherein the fine resistor divider string includes two end resistor segments on each end of the fine resistor divider string each having a resistance value that is a fraction of the nominal resistance value of the remaining fine resistor divider segments, the remaining intervening fine resistor segments each having substantially equal nominal resistance value.

3. The precision digital-to-analog converter of claim 2, wherein the coupling switches have an on-resistance value that is less than or about equal to one-fourth of the nominal resistance value of the fine resistor segments.

4. The precision digital-to-analog converter of claim 2, wherein the coupling switches have an average on-resistance value that is about one-eighth the nominal resistance value of the fine resistor segments.

5. The precision digital-to-analog converter of claim 1, wherein the fine resistor divider string includes two end resistor segments on each end of the fine resistor divider string each having a resistance value that is about three-fourths of the nominal resistance value of the remaining fine resistor divider segments, the remaining intervening fine resistor segments each having substantially equal nominal resistance values.

6. The precision digital-to-analog converter of claim 1, wherein the fine resistor segments have a nominal resistance that is about four times a resistance of a coarse resistor segment.

7. The precision digital-to-analog converter of claim 1, wherein the fine resistor divider string includes $2^N$ resistor segments controlled by N number of least-significant-bits and a least-significant bit of the M coarse divider control bits, and wherein when the least significant bit of the M bits is a one the fine resistor divider string is driven by the two's complement of the N least-significant-bits.

8. The precision digital-to-analog converter of claim 1, wherein the fine resistor divider string includes $2^N+1$ resistor segments controlled by N number of least-significant-bits and a least-significant bit of the M coarse divider control bits, and wherein when the least significant bit of the M bits is a one the fine resistor divider string is driven by the one's complement of the N least-significant-bits.

9. A precision digital-to-analog converter with cascaded coarse and fine resistor divider strings, the digital-to-analog converter comprising:
   a parallel switching tree switchably coupling the fine resistor divider string to an analog output, the switching tree including mirror-imaged NMOS and PMOS switches connected in parallel, wherein the NMOS switches are operable when the fine resistor divider string is connected across a coarse divider string segment having an absolute voltage thereupon of about Vdd/2 or greater, and wherein the PMOS switches are operable when the fine resistor divider string is connected across a coarse divider string segment having an absolute voltage thereupon of about Vdd/2 or less,
   an on-resistance of the coupling switches being less than or about equal to one-fourth of a nominal resistance value of a fine resistor divider string segment,
   the coarse resistor divider string connected between source voltages,
   the fine resistor divider string includes $2^N$ resistor segments simultaneously controlled by N number of least-significant-bits and a least-significant bit of the M coarse divider control bits, and wherein when the least significant bit of the M bits is a one the fine resistor divider string is driven by the two's complement of the N least-significant-bits, the fine resistor divider string includes two end resistor segments on each end of the fine resistor divider string each having a resistance value that is a fraction of the nominal resistance value of the remaining fine resistor divider segments, the remaining intervening fine resistor segments each having substantially equal nominal resistance values.

10. The precision digital-to-analog converter of claim 9, wherein the end resistor segments within the $2^N$ resistor segments of the fine resistor divider string each having a resistance that is about three-fourths of the nominal resistance of the remaining fine resistor divider string segments.

11. The precision digital-to-analog converter of claim 9, wherein the coupling switches have an on-resistance value that is less than or about equal to one-eighth the nominal resistance value of the fine resistor segments.

12. The precision digital-to-analog converter of claim 9, wherein the fine resistor segments have a nominal resistance that is about four times a resistance of a coarse resistor segment.

13. An analog-to-digital converter including a comparator, a control circuit and a precision digital-to-analog converter with cascaded coarse and fine resistor divider strings, the digital-to-analog converter comprising:
   a parallel switching tree switchably coupling the fine resistor divider string to an analog output, the switching tree including a plurality of mirror-imaged NMOS and PMOS coupling switches connected in parallel and simultaneously controlled by the N number of least-significant-bits and a least-significant bit of the M coarse divider control bits such that a voltage output of the digital-to-analog converter has a substantially full rail-to-rail voltage range, and wherein the NMOS switches are operable when the fine divider string is connected across a coarse divider string segment having an absolute voltage thereupon of about Vdd/2 or greater, and wherein the PMOS switches are operable when the fine divider string is connected across a coarse divider string segment having an absolute voltage thereupon of about Vdd/2 or less;
   the fine resistor divider string including $2^N$ or greater fine resistor segments controlled by N number of least-significant-bits; and
   an on-resistance of the coupling switches being a fraction of a nominal resistance value of a fine resistor divider string segment.

14. A microprocessor including a memory, arithmetic logic unit, and a precision digital-to-analog converter with cascaded coarse and fine resistor divider strings, the digital-to-analog converter comprising:
   a parallel switching tree switchably coupling the fine resistor divider string to an analog output, the switching tree including a plurality of mirror-imaged NMOS and PMOS coupling switches connected in parallel and simultaneously controlled by the N number of least-significant-bits and a least-significant bit of the M coarse divider control bits such that a voltage output of the digital-to-analog converter has a substantially full rail-to-rail voltage range, and wherein the NMOS switches are operable when the fine divider string is connected across a coarse divider string segment having an absolute voltage thereupon of about Vdd/2 or greater, and wherein the PMOS switches are operable when the fine divider string is connected across a coarse divider string segment having an absolute voltage thereupon of about Vdd/2 or less;
   the fine resistor divider string including $2^N$ or greater fine resistor segments controlled by N number of least-significant-bits; and
   an on-resistance of the coupling switches being a fraction of a nominal resistance value of a fine resistor divider string segment.

15. A temperature compensated crystal oscillator circuit including a piezoelectric resonator, a temperature sensor, a voltage regulator, a memory, and a precision digital-to-analog converter with cascaded coarse and fine resistor divider strings, the digital-to-analog converter comprising:
   a parallel switching tree switchably coupling the fine resistor divider string to an analog output, the switching tree including a plurality of mirror-imaged NMOS and PMOS coupling switches connected in parallel and simultaneously controlled by the N number of least-significant-bits and a least-significant bit of the M coarse divider control bits such that a voltage output of the digital-to-analog converter has a substantially full rail-to-rail voltage range, and wherein the NMOS switches are operable when the fine divider string is connected across a coarse divider string segment having an absolute voltage thereupon of about Vdd/2 or greater, and wherein the PMOS switches are operable when the fine divider string is connected across a coarse divider string segment having an absolute voltage thereupon of about Vdd/2 or less;

the fine resistor divider string including $2^N$ or greater fine resistor segments controlled by N number of least-significant-bits; and an on-resistance of the coupling switches being a fraction of a nominal resistance value of a fine resistor divider string segment.

\* \* \* \* \*